United States Patent
Emrich et al.

(10) Patent No.: US 9,667,224 B2
(45) Date of Patent: May 30, 2017

(54) ELECTROACOUSTIC FILTER COMPRISING LOW-PASS CHARACTERISTICS

(71) Applicant: Snaptrack Inc., San Diego, CA (US)

(72) Inventors: Holger Emrich, Munich (DE); Clemens Ruppel, Munich (DE); Martin Störkle, Ebersberg (DE); Werner Ruile, Munich (DE); Thomas Finteis, Neubiberg (DE); Tilo Gärtner, Munich (DE); Ingo Bleyl, Munich (DE); Markus Mayer, Taufkirchen (DE)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 14/438,598

(22) PCT Filed: Sep. 27, 2013

(86) PCT No.: PCT/EP2013/070235
§ 371 (c)(1),
(2) Date: Apr. 24, 2015

(87) PCT Pub. No.: WO2014/067725
PCT Pub. Date: May 8, 2014

(65) Prior Publication Data
US 2015/0288347 A1    Oct. 8, 2015

(30) Foreign Application Priority Data

Nov. 2, 2012    (DE) ................ 10 2012 110 504

(51) Int. Cl.
*H03H 9/64*    (2006.01)
*H03H 9/54*    (2006.01)
(Continued)

(52) U.S. Cl.
CPC .............. *H03H 9/643* (2013.01); *H03H 9/54* (2013.01); *H03H 9/64* (2013.01); *H03H 9/6406* (2013.01);
(Continued)

(58) Field of Classification Search
CPC .......... H03H 9/54; H03H 9/64; H03H 9/6406; H03H 9/643; H03H 9/02708; H03H 9/02716; H03H 9/02795; H03H 9/14558
(Continued)

(56) References Cited

U.S. PATENT DOCUMENTS 4,599,532 A * 7/1986 Okamoto ............... G06G 7/195
                                                          310/313 B
5,126,706 A   6/1992 Fleischmann et al.
(Continued)

FOREIGN PATENT DOCUMENTS

DE    102008050170 A1    5/2009
EP         0386009 B1    4/1993
(Continued)

OTHER PUBLICATIONS

Fleischmann, B., "Entwurf höchstfrequenter akustischer Oberflächenwellenfilter (Design of very high frequency acoustic surface wave filters)," Dissertation, Forschrittsberichte VDI (VDI Progress Report), Reihe 10: Informatik/Kommunikationstechnik Nr. 274 (Series 10: Information/Communication Technology No. 274), VDI-Verlag Düsseldorf 1994, pp. 66-85.

*Primary Examiner* — Robert Pascal
*Assistant Examiner* — Jorge Salazar, Jr.

(57) ABSTRACT

An electroacoustic filter has improved low-pass characteristics. The filter includes a first electroacoustic converter, an electroacoustic element and a grid structure between the converter and the element. The grid structure is acoustically (Continued)

active in one frequency range that lies above the acoustically active frequency range of the first electroacoustic converter.

19 Claims, 3 Drawing Sheets

(51) Int. Cl.
  *H03H 9/02* (2006.01)
  *H03H 9/145* (2006.01)
(52) U.S. Cl.
  CPC ..... *H03H 9/02708* (2013.01); *H03H 9/02716* (2013.01); *H03H 9/02795* (2013.01); *H03H 9/14558* (2013.01)
(58) Field of Classification Search
  USPC .................. 333/133, 193–196; 310/313 D
  See application file for complete search history.

(56) References Cited

U.S. PATENT DOCUMENTS

| | | | |
|---|---|---|---|
| 7,569,971 B2 | | 8/2009 | Andle et al. |
| 2010/0102901 A1 | | 4/2010 | Tsuda |

FOREIGN PATENT DOCUMENTS

| | | | |
|---|---|---|---|
| EP | 1411634 A1 | | 4/2004 |
| EP | 2180597 A1 | | 4/2010 |
| GB | 2252214 A | | 7/1992 |
| JP | H08335848 A | | 12/1996 |
| JP | 2005203996 A | * | 7/2005 |
| JP | 2010103849 A | | 5/2010 |
| JP | 2010171805 A | | 8/2010 |
| JP | 20101717805 A | | 8/2010 |
| JP | 2011041007 A | | 2/2011 |

* cited by examiner

ELECTROACOUSTIC FILTER COMPRISING LOW-PASS CHARACTERISTICS

This patent application is a national phase filing under section 371 of PCT/EP2013/070235, filed Sep. 27, 2013, which claims the priority of German patent application 10 2012 110 504.9, filed Nov. 2, 2012, each of which is incorporated herein by reference in its entirety.

TECHNICAL FIELD

The present invention relates to electroacoustic filters suitable, for example, for use in front-end circuits in mobile communication devices, having a low-pass characteristic.

BACKGROUND

In electroacoustic filters, electroacoustically active structures are arranged on a generally piezoelectric material. The electroacoustic structures are able to convert between electromagnetic RF (radio-frequency) signals and acoustic waves which are able to propagate in an acoustic track. In particular, electroacoustic filters may be designed as bandpass filters. Such bandpass filters allow desirable signals in a frequency range around a center frequency f to pass, i.e., their insertion loss at these passband frequencies is low. On the other hand, bandpass filters should block frequency components outside the passband. In other words, the insertion loss of filters at frequencies outside the passband is high.

Conventional RF circuits may comprise electrical matching circuits in order also to suppress certain undesirable frequency ranges via a zero point of the electrical matching circuit. Furthermore, it is possible to design electroacoustic devices which are electroacoustically inactive in a particularly sensitive frequency range.

Known measures for suppressing undesirable frequency components are disadvantageous in that the design flexibility, for example, in a matching network or in the design of the electroacoustic transducer, is limited. An additional problem is that measures for suppressing undesirable frequency components may degrade the frequency-dependent impedance of the corresponding transducer structures and/or matching networks.

SUMMARY

Embodiments of the present invention provide an electroacoustic filter that improves the suppression of signals above the passband, which allows for improved flexibility when designing the filter and which facilitates the impedance matching. In particular, the suppression of undesirable signals having frequency components above the passband is to be obtained via a measure which entails none of the aforementioned disadvantages of known filters.

An electroacoustic filter comprises an acoustic track and a first electroacoustic transducer arranged in the acoustic track. The first electroacoustic transducer is acoustically active in a frequency range around a center frequency $f_1$. The filter furthermore comprises an acoustic element arranged in the acoustic track which is acoustically active in the frequency range around the center frequency $f_1$. The filter furthermore comprises a grid structure arranged in the acoustic track between the first electroacoustic transducer and the acoustic element. The grid structure is acoustically active in a frequency range around a center frequency $f_2$. The center frequency $f_2$ is greater than the center frequency $f_1$.

The acoustic track is an area of the filter in which acoustic waves are able to propagate. The acoustic track may be the surface of a piezoelectric substrate on which surface acoustic waves (SAWs) are able to propagate. The acoustic track may also be a piezoelectric material on which additional layers are present. The thickness of these additional layers may be such that the acoustic wave travels essentially within the layer system, and practically no excursion is detectable at the surface. In this case, reference is made to guided bulk acoustic waves (GBAWs).

The electroacoustic transducer may comprise comb-like meshed electrode fingers which are arranged on a piezoelectric substrate, or more generally, on a piezoelectric material. The electroacoustic transducer may, for example, be an interdigital transducer as known from a plurality of SAW devices, and comprise oppositely arranged busbars which are connected to electrode fingers.

The acoustic element arranged in the acoustic track may be a device which is arranged on a piezoelectric substrate and which interacts with acoustic waves. The acoustic element may, for example, be an additional electroacoustic transducer, a reflector, or a deflecting structure.

The grid structure arranged between the first electroacoustic transducer and the acoustic element is also a device which is able to interact with acoustic waves. The interaction of the grid structure with acoustic waves is frequency-selective. The grid structure thus essentially interacts with waves having a frequency which is higher than frequencies which interact with the first electroacoustic transducer or the acoustic element.

If the frequency range is around the center frequency $f_1$ of the operating range of the electroacoustic filter, i.e., a passband of the electroacoustic filter, the grid structure essentially does not disturb the interaction of the first electroacoustic transducer with the acoustic element. On the other hand, it is possible that the grid structure prevents or at least reduces signals having a higher frequency, for example, twice the frequency, from propagating from the electroacoustic transducer to the acoustic element or from the acoustic element to the electroacoustic transducer. For example, if the first electroacoustic transducer and the acoustic element constitute an input or output transducer of a SAW bandpass filter, undesirable frequency components above the passband and in particular frequencies around the second harmonic are eliminated or attenuated. Thus, an electroacoustic filter having a low-pass filter characteristic is obtained.

In one specific embodiment, the acoustic element is correspondingly a second electroacoustic transducer, a reflector, and/or a deflecting structure. It is in particular possible that the acoustic element is an electroacoustic transducer having an acoustic finger pitch which is similar to or identical to the acoustic finger pitch of the first electroacoustic transducer. A reflector is a device which reflects acoustic waves, in which the direction of propagation of the waves is rotated by 180° relative to an axis orthogonal to the surface of the acoustic track. A deflecting structure may be a device which modifies the direction of propagation of acoustic waves by any arbitrary angle. A reflector thus constitutes a special case of a deflecting structure.

The acoustic element may also comprise electrode fingers and busbars connected to the electrode fingers, for example, made up of a structured metallization. The acoustic element may be connected to a signal path of the filter. However, it is also possible that there is no galvanic connection to signal paths of the filter.

In one specific embodiment, the grid structure is a reflecting structure and/or a bulk wave conversion structure. The electroacoustic filter functions using surface acoustic waves (SAWs) or guided bulk acoustic waves (GBAWs).

If the grid structure is a reflecting structure, it constitutes a device which reflects acoustic waves. Since the grid structure is arranged between the first electroacoustic transducer and the acoustic element, a propagation of signals in the frequency range around the center frequency $f_2$ from the first electroacoustic transducer to the acoustic element or vice-versa is suppressed. The attenuation is correspondingly increased at precisely these frequencies.

A bulk wave conversion structure is a device which converts waves propagating on a surface, for example, SAWs, or waves propagating on an interface, for example, GBAWs, into bulk waves. Bulk waves are waves whose propagation is not linked to a surface or to a phase interface. Bulk waves may thus submerge into a piezoelectric substrate and distribute acoustic energy from the surface of a piezoelectric substrate to the volume of the substrate. The energy is able to dissipate there. If undesirable frequency components are now converted into bulk waves around a center frequency $f_2$ on the surface and dissipated in the substrate, precisely these frequency components are no longer able to disturb the passband characteristic of the filter. The filtering characteristic of the filter is improved. In particular, it is possible that the rear side of a piezoelectric substrate is roughened in order to prevent a directed reflection of the bulk waves. Furthermore, it is possible to arrange bulk-wave absorbing materials, for example, an elastic material, on the lower side of the substrate. Such a material may be an elastic adhesive via which a piezoelectric substrate is affixed to a carrier substrate.

The pitch of the grid structure may be set in such a way that the so-called onset frequency $f_{onset}=1/(P(1/v_0+1/v_v))$ is met. Here, $v_0$ is the velocity of a surface wave or interface wave, for example, a guided bulk wave, $v_v$ is the velocity of a bulk wave, and P is the geometric pitch of the grid.

Bulk-wave conversion is known, for example, from the dissertation entitled "Entwurf höchstfrequenter akustischer Oberflächenwellenfilter" (Design of very high frequency acoustic surface wave filters) by B. Fleischmann (VDI Progress Reports, Series 10: Information/Communication Technology No. 274, VDI-Verlag, Düsseldorf, 1994, pp. 66-85).

Furthermore, it is possible that the grid structure comprises such an arrangement of elements interacting with acoustic waves, so that the grid structure is both a reflecting structure and a bulk wave conversion structure.

In one specific embodiment, the first electroacoustic transducer, the acoustic element, and the grid structure are designed in such a way that the following essentially applies: $f_2=2f_1$. Thus, mildly disturbing second harmonics may be attenuated or eliminated.

In one specific embodiment, the grid structure includes a grid pitch $P_G$ which is selected in order to dissipate acoustic energy of a frequency component $f>f_1$. In the present electroacoustic filter, the following relationship essentially applies, as is generally the case with devices functioning using acoustic surface waves: the pitch is a measure of the wavelength of the acoustic wave. The wavelength λ of the acoustic wave essentially corresponds to the quotient formed from the propagation velocity v and the frequency f of the acoustic wave.

In one specific embodiment, the first electroacoustic transducer includes an area having a grid pitch of $P_1$. The acoustic element includes an area having the grid pitch of $P_1$ and the grid structure includes an area having a grid pitch of $P_G$, for example, $P_G>P_1$. The grid pitch is essentially understood to be the distance between the finger centers of adjacent electrode fingers.

A distinction is to be made between normal finger transducers, in which adjacent fingers are subjected to different polarities, and so-called split-finger transducers, in which two fingers having the same polarity are arranged adjacent to one another.

The following apply to normal finger transducers: $P_G>=0.5P_1$ and/or $P_G<P_1$. The following applies to split-finger transducers: $P_G>=P_1$.

The grid pitch and the associated frequency behave in a reciprocal manner. Thus, a smaller grid pitch is associated with a higher frequency, and vice-versa.

In one specific embodiment, $P_G$ is selected from: a pitch $P>0.5P_1$, a pitch $P>0.5*1.030P_1$, a pitch $P>0.5*1.035P_1$.

In the case of split-finger transducers, $P_G$ may be selected from: a pitch $P>=P_1$, a pitch $P>=1.030P_1$, a pitch $P>=1.035P_1$, a pitch $P>=1.20P_1$.

The pitch $1.20*P_1<=P_G<=1.40*P_1$, for example, $P_G=1.3*P_1$, may be advantageous in particular in the case of an X 112.2° Y LiTaO$_3$ (LiTaO$_3$=lithium tantalate) substrate.

It is thus possible that the grid pitch of the grid structure is enlarged by several percent in comparison with half of the grid pitch of the first electroacoustic transducer and the acoustic element. By deviating from the factor 0.5, it is essentially possible to set whether more acoustic energy is reflected or is converted into bulk-wave energy.

In one specific embodiment, the first electroacoustic transducer is a split-finger transducer. The split-finger transducer has an area having an acoustic grid pitch $P_1$. The acoustic element is a second electroacoustic transducer having an area having the acoustic grid pitch $P_1$. The grid structure has an area having a grid pitch $P_G$, in which the following applies: $P_G>P_1$.

In contrast to conventional transducers, split-finger transducers are characterized in that, per acoustic half-wavelength, two electrode fingers having the same polarity are arranged adjacent to one another and are connected to the same busbar. Such a structure may excite or absorb acoustic waves having the wavelength λ. While in conventional transducers, the distance of the finger centers of electrode fingers which are arranged adjacent to one another essentially determines the half-wavelength λ/2, in a split-finger transducer, the distance of the finger centers of electrode fingers arranged directly adjacent to one another essentially determines λ/4.

Irrespective of the transducer type, it is thus possible that $P_G>=\lambda/4$, or that $P_G>=1.030*\lambda/4$, or that $P_G>=1.035*\lambda/4$.

The percentage by which the pitch of the grid structure should be moved relative to the grid pitch of the first transducer in order to obtain an optimal filter may, for example, be determined via simulation calculations.

An equivalent option for describing the relationships of the grid pitches for normal-finger and split-finger structures is to introduce a stretching factor s. The following then apply:

PG=s*P1 for split-finger transducers, and
PG=0.5*s*P1 for normal-finger transducers.

Generally, s>1 is then valid. For example, the following values are then possible:
s>=1.03;
s>=1.20, for example, for X 112.2° Y LiTaO$_3$;
1.20<=s<=1.4, for example, for X 112.2° Y LiTaO$_3$;
s=1.3, for example, for X 112.2° Y LiTaO$_3$.

For signals having the frequency $f_1$, the grid structure preferably has no attenuating effect. An attenuating effect is avoided via a split-finger structure. This is true as long as s is sufficiently close to 1.

In a filter in which the first electroacoustic transducer is a split-finger transducer and the grid structure comprises electrode fingers arranged adjacent to one another, the grid pitch of the split-finger transducer may essentially match the grid pitch of the grid structure, and corresponding electrode fingers may be manufactured via the same structuring measures. Nonetheless, the grid structure is then transparent to signals in the frequency range around the center frequency $f_1$, while undesirable signals having twice the frequency are reflected with high efficiency or are converted into bulk waves.

In one specific embodiment, the first transducer, the acoustic element, and/or the grid structure are designed a fan shaped structures of a FAN filter. The acoustically active structures have an increasing pitch, for example, a linearly increasing pitch, along the aperture, i.e., perpendicular to the direction of propagation of the acoustic waves. It is thus easily possible to obtain filters functioning in a broadband manner, which nonetheless have a low insertion loss in the passband and a high insertion loss outside the passband.

The electrode fingers thus have a fan-shaped, divergent structure, to which their name may be attributed.

In one specific embodiment, the grid structure comprises a metallization, a dielectric material, or recesses in the material of the acoustic track. The grid structure thus manufactured therefore includes a device which is simple to manufacture, which couples sufficiently well with the acoustic waves.

In one specific embodiment, the filter furthermore comprises a phase structure in the acoustic track between the first transducer and the grid structure and/or between the grid structure and the acoustic element. The propagation velocity of an acoustic wave within the phase structure deviates from the velocity of an acoustic wave outside the phase structure. Such a phase structure thus causes a phase shift relative to an acoustic track without a phase structure, due to the varying propagation velocity of the acoustic wave. Thus, a phase correction of the acoustic wave may be achieved in a simple manner.

A phase structure may, for example, be used in combination with FAN transducers. In FAN transducers, the route which an acoustic wave must travel and which is covered by a metallization, changes. Different routes running in parallel within the transducer along the direction of propagation are subject to a different phase change via the transducer and/or acoustic elements and/or grid structures of corresponding filters. The phase structure thus makes possible to easily correct a corresponding phase change. The total phase of the acoustic wave is changed. However, the acoustic wave along the aperture then again has essentially the same phase position.

It is possible that the electroacoustic filter comprises a $LiTaO_3$ X 112.2° Y substrate as a piezoelectric substrate.

The use of other substrates, for example, comprising lithium niobate ($LiNbO_3$), for example, $LiNbO_3$ YZ, $LiNbO_3$ 128° YX, or quartz and other crystal cuts of $LiTaO_3$ substrates, for example, $LiTaO_3$ 42° YX, $LiTaO_3$ 39° YX, is also possible.

It is possible that the grid structure is connected to a ground potential. It is then possible that the grid structure reduces electrical crosstalk.

The reduction of second harmonics furthermore reduces second-order intermodulation products which could result from the fundamental frequency, and other mixing products which result from the second-order intermodulation products, for example, third-order intermodulation products.

It is possible to arrange a corresponding grid structure in one or in multiple acoustic signal paths, for example, in multi-stage transducers.

Furthermore, the use of a corresponding grid structure in single-port resonators is possible. The acoustic element may then in particular be a reflector or a deflecting structure.

The grid structure may furthermore find use in DMS (double-mode surface acoustic wave) filters.

The composition of the reflecting or converting element structures of the grid structure is not limited to a single type; it is possible that the grid structure comprises recesses, metallizations, and dielectric materials.

It is possible that the transducers include stub fingers in a lateral area of the acoustic track. As a result, the effective aperture of the transducer structures decreases, but an improvement of the dominant acoustic oscillation mode, for example, obtaining a so-called track mode, may be obtained.

BRIEF DESCRIPTION OF THE DRAWINGS

The electroacoustic filter and underlying ideas are described in greater detail below based on exemplary embodiments and associated schematic figures.

DETAILED DESCRIPTION OF ILLUSTRATIVE EMBODIMENTS

Figure 1:
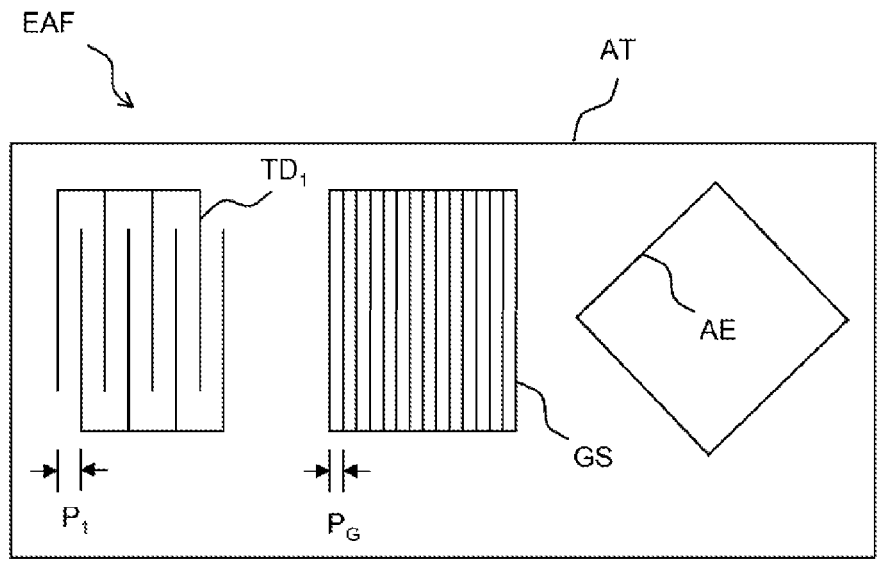
FIG. 1 shows a schematic embodiment of the electroacoustic filter having the grid structure between the first electroacoustic transducer and the acoustic element.

FIG. 1 schematically depicts one specific embodiment of an electroacoustic filter EAF including a first electroacoustic transducer $TD_1$ and an acoustic element AE. The first electroacoustic transducer $TD_1$ and the acoustic element AE are arranged in the acoustic track AT. A grid structure GS is arranged between the first electroacoustic transducer $TD_1$ and the acoustic element AE. The first electroacoustic transducer $TD_1$ is acoustically active in a frequency range around a center frequency $f_1$, wherein the center frequency f is determined by the pitch $P_1$ via the transducer structure.

The grid structure GS comprises structured strips which, for example, are manufactured from a metallization in which the first electroacoustic transducer is formed. The grid pitch of the grid structure GS, i.e., the center-to-center distance between the strips, is $P_G$. If $P_G$ is suitably set relative to $P_1$, the grid structure GS is then transparent to acoustic waves of the frequency range around the center frequency of the electroacoustic transducer, while acoustic waves of higher frequency are reflected and/or converted into bulk waves.

The influence of corresponding undesirable frequency components on the acoustic element AE is therefore eliminated or at least reduced.

Figure 2:
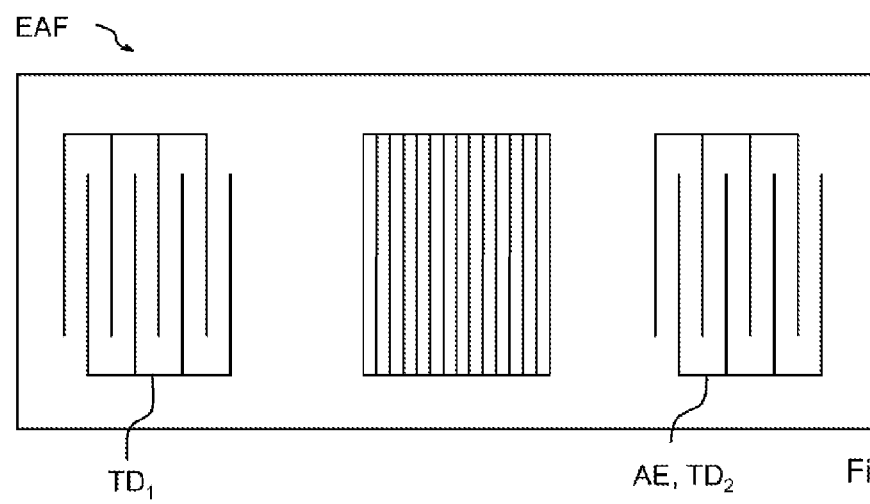
FIG. 2 shows one specific embodiment, in which the acoustic element is designed as a second electroacoustic transducer.

FIG. 2 schematically depicts one specific embodiment of an electroacoustic filter EAF, in which the acoustic element AE is designed as an electroacoustic transducer $TD_2$. The electroacoustic filter EAF thus comprises the first electroacoustic transducer $TD_1$ and the second electroacoustic transducer $TD_2$ as well as the grid structure GS between them. One of the two transducers may be an input transducer, while the corresponding other transducer is an output transducer. Thus, a two-port filter having an improved low-pass characteristic may be obtained.

Figure 3:
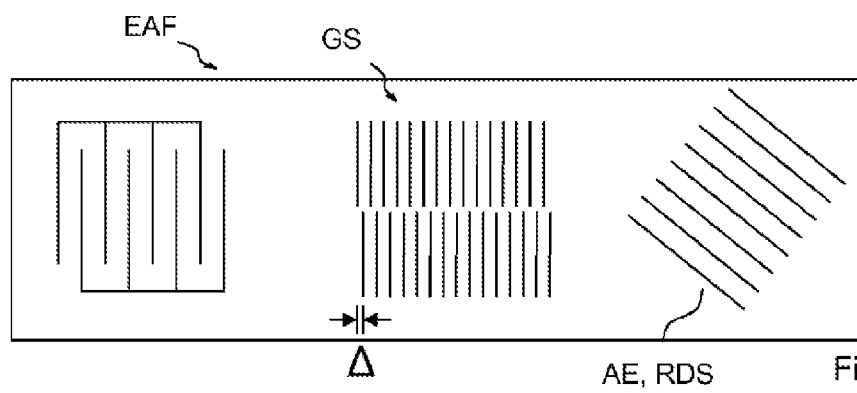
FIG. 3 shows one specific embodiment, in which the acoustic element is designed as a deflecting structure.

FIG. 3 shows one specific embodiment of the electroacoustic filter EAF, in which the acoustic element AE is designed as a deflecting structure EADS. Acoustic waves which, for example, are transmitted by the first electroacoustic transducer and, passing through the grid structure GS, reach the acoustic element AE, may thus be deflected in a different direction. It is possible that the deflecting structure EADS is oriented such that electroacoustic waves are reflected back to the first electroacoustic transducer. The deflecting structure EADS then constitutes a reflector.

Furthermore, it is possible that the grid structure GS is staged. The grid structure GS then comprises areas which are offset by a distance Δ with respect to another area of the grid structure GS. Residual reflections which are possibly present may then be suppressed. At an offset of $\Delta=P_G/2$, for example, residual reflections may be suppressed via destructive interference.

Figure 4:
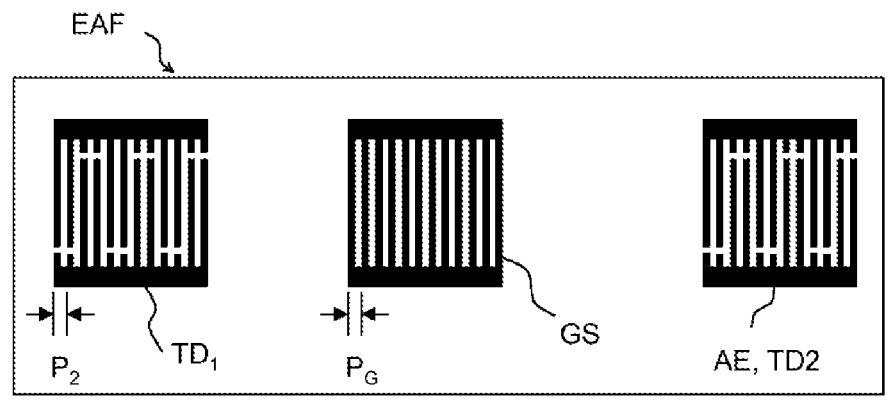
FIG. 4 shows one specific embodiment, in which the first electroacoustic transducer and the acoustic element are equipped as split-finger transducers.

FIG. 4 schematically depicts one specific embodiment, in which the acoustic element AE is designed as a second electroacoustic transducer $TD_2$. The first electroacoustic transducer $TD_1$ and the second electroacoustic transducer $TD_2$ are designed as split-finger transducers. The distance of the finger centers of adjacent fingers P essentially determines one-quarter of the wavelength of the acoustic wavelength at the operating frequency of the first electroacoustic transducer. The same applies to the second electroacoustic transducer $TD_2$. The distance of the finger centers of adjacent fingers of the grid structure GS is of the same order of magnitude as the structural finger distance P of the first electroacoustic transducer $TD_1$. The electrode fingers of the transducers and the grid structure GS have essentially the same distance from the adjacent electrode fingers and may be implemented via the same manufacturing steps and using the same type of manufacture. Nevertheless, the grid structure GS is essentially transparent to the operating frequencies of the first and the second electroacoustic transducer $TD_1$, $TD_2$, but impermeable to higher frequencies, in particular, twice the frequency.

Figure 5:
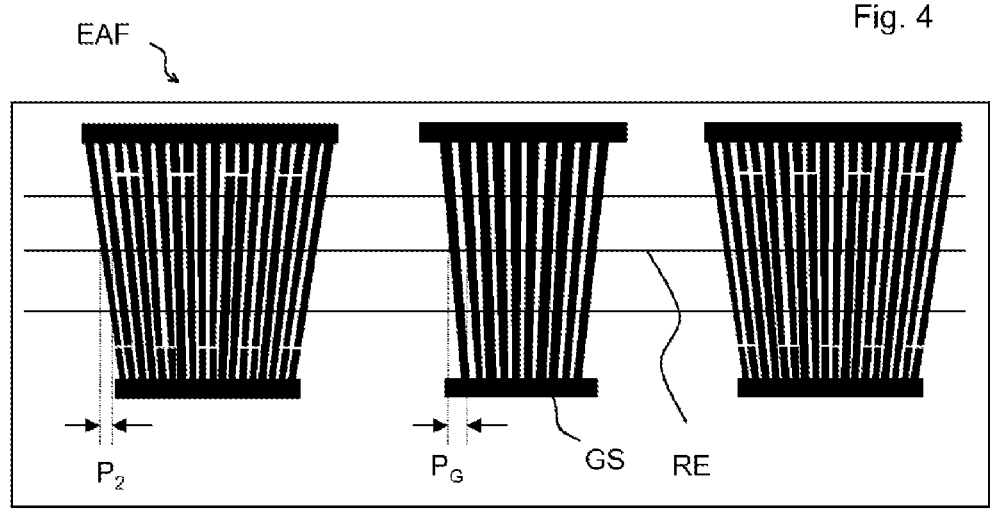
FIG. 5 shows one embodiment, in which the first electroacoustic transducer, the acoustic element, and the grid structure between them are FAN-shaped.

FIG. 5 schematically depicts one specific embodiment of the electroacoustic filter EAF, in which the first electroacoustic transducer, the second electroacoustic transducer, and the grid structure GS are fan-shaped. The distance of the finger centers and the width of the fingers increase from one side of the acoustic track to the other side of the acoustic track, i.e., along the aperture. The information with respect to the frequencies or grid pitches therefore applies only to transverse areas of the acoustic track which correspond to one another. In this respect, transverse areas are areas which are arranged adjacent to one another in the longitudinal direction relative to the acoustic track and which have a defined distance from one side of the acoustic track, for example, from the area of the busbar. The various areas RE are represented by lines running in parallel along the direction of propagation of the acoustic waves.

Like FIG. 4, FIG. 5 shows the option of stub fingers in the first electroacoustic transducer and in the second electroacoustic transducer. The stub fingers are arranged next to fingers having the same polarity and essentially do not contribute to the excitation of acoustic waves.

Figure 6:
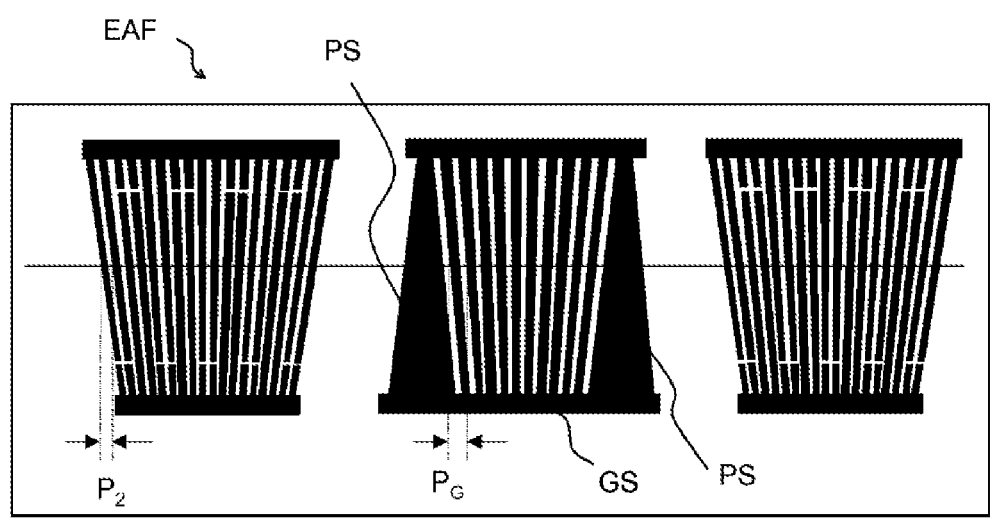
FIG. 6 shows one embodiment, in which the grid structure includes two phase structures.

FIG. 6 schematically depicts one specific embodiment of the electroacoustic filter EAF, in which a phase structure PS is arranged between the first electroacoustic transducer and the grid structure GS. A second phase structure PS is arranged between the grid structure GS and the second electroacoustic transducer as an acoustic element. Both phase structures may contribute to reducing or harmonizing phase differences caused by the fan-shaped design of the transducers and the grid structure in different areas RE of the acoustic track.

The phase structures PS may also comprise the metallizations from which at least the first electroacoustic transducer is structured.

All arrangements which influence the propagation velocity of an acoustic wave are essentially possible as phase structures. The propagation velocity may thus be increased or reduced locally.

Figure 7:
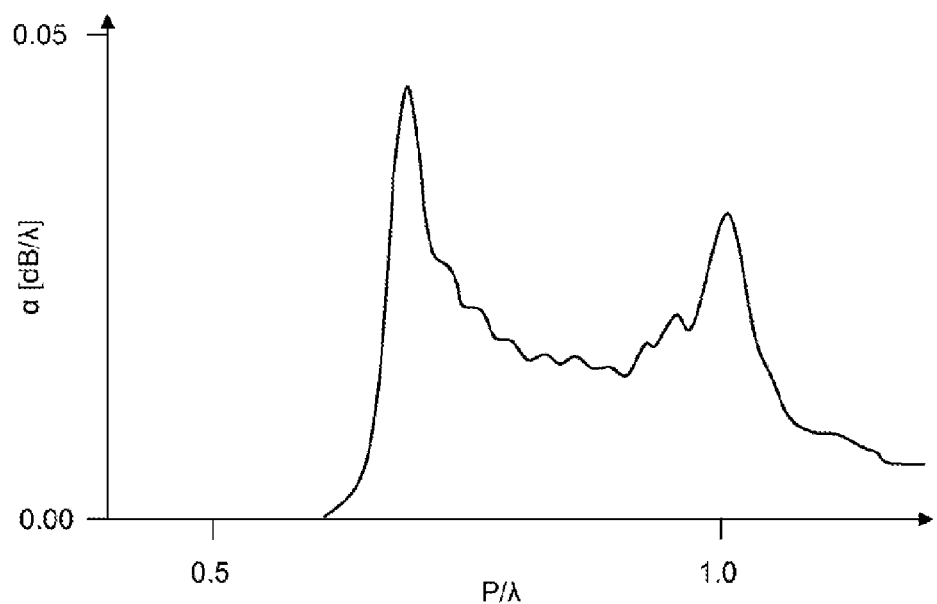
FIG. 7 shows the frequency-dependent attenuation coefficients of a grid structure.

FIG. 7 depicts the attenuation a in dB per wavelength λ in a $LiNbO_3$ substrate which experiences a surface wave, plotted over the normalized grid pitch, wherein the onset frequency for the bulk wave conversion is realized by attaining a value of the attenuation coefficient which is non-zero, here, for example, at approximately $P/\lambda=0.65$ (see, e.g., B. Fleischmann, VDI Progress Reports, Series 10: Information/Communication Technology No. 274, VDI-Verlag, Düsseldorf, 1994, pp. 81-82).

Figure 8:
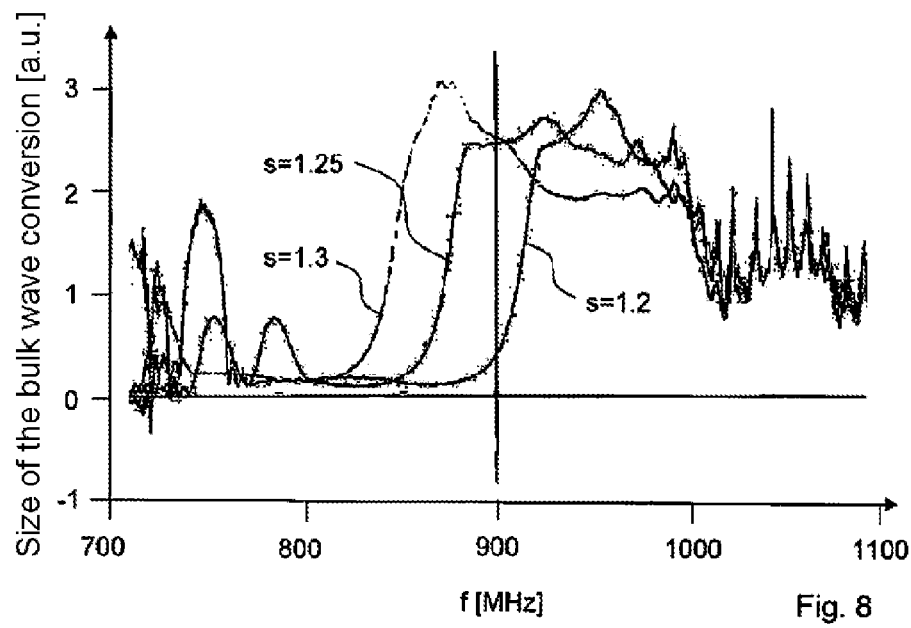
FIG. 8 shows the insertion loss of an electroacoustic filter having a grid structure.

FIG. 8 shows the frequency-dependent attenuation plotted over the frequency, in which various stretching factors s, i.e., 1.2, 1.25, and 1.3, were used for the grid stretching. The frequency 2f to be attenuated is 900 MHz, depicted by the perpendicular line. A sufficient bulk attenuation exists as of an attenuation of 1.25. This stretching corresponds to a normalized grid pitch of $P_G/\lambda=1.25/2=0.625$. The substrate material is $LiTaO_3$ X 112.2° Y.

An electroacoustic filter is not limited to one of the described exemplary embodiments. Combinations of features and variations of the examples which, for example, comprise additional metallization structures, also constitute exemplary embodiments according to the present invention. In particular, any aforementioned features may be combined in order to obtain electroacoustic filters which should satisfy specific requirements.

The invention claimed is:
1. An electroacoustic filter, comprising:
   an acoustic track;
   a first electroacoustic transducer arranged in the acoustic track, the first electroacoustic transducer being acoustically active in a frequency range around a center frequency $f_1$;
   an acoustic element arranged in the acoustic track, the acoustic element being acoustically active in the frequency range around the center frequency $f_1$;
   a grid structure arranged in the acoustic track between the first electroacoustic transducer and the acoustic element, wherein the grid structure is acoustically active in a frequency range around a center frequency $f_2$, where $f_2>f_1$ and wherein the grid structure has a grid pitch $P_G$, which is selected in order to dissipate energy of a frequency component $f>f_1$; and wherein the grid structure is arranged as a bulk wave conversion structure, wherein the electroacoustic filter functions using acoustic surface waves or guided bulk acoustic waves.

2. The electroacoustic filter according to claim 1, wherein the acoustic element comprises a second electroacoustic transducer, a reflector, and/or a deflecting structure.

3. The electroacoustic filter according to claim 1, wherein $f_2$ lies in a range around $2*f_1$.

4. The electroacoustic filter according to claim 1, wherein
the first electroacoustic transducer includes an area having a grid pitch of $P_1$;
the acoustic element includes an area having the grid pitch of $P_1$; and
the grid pitch of the grid structure $P_G < P_1$.

5. The electroacoustic filter according to claim 4, wherein the grid pitch of the grid structure $P_G$ comprises a pitch selected from the group consisting of a pitch $P > 0.5*P_1$, a pitch $P > 0.5*1.030*P_1$, and a pitch $P > 0.5*1.035*P_1$.

6. The electroacoustic filter according claim 1, wherein the acoustic element includes split fingers having an area of split fingers having a grid pitch of $P_1$, and wherein the grid pitch of the grid structure comprises a pitch selected from the group consisting of a pitch $P > P_1$, a pitch $P > 1.030*P_1$, a pitch $P > 1.035*P_1$, and a pitch $P > 1.20*P_1$.

7. The electroacoustic filter according to claim 1, wherein the first electroacoustic transducer, the acoustic element, and/or the grid structure is designed as fan-shaped structures of a FAN filter.

8. The electroacoustic filter according to claim 1, wherein the grid structure comprises a metallization, a dielectric material, or recesses in the material of the acoustic track.

9. The electroacoustic filter according to claim 1, further comprising a phase structure in the acoustic track between the first electroacoustic transducer and the grid structure and/or between the grid structure and the acoustic element, wherein the velocity of an acoustic wave in the phase structure deviates from the velocity of the acoustic wave in the acoustic track outside the phase structure.

10. An electroacoustic filter, comprising:
an acoustic track;
a first electroacoustic transducer arranged in the acoustic track, the first electroacoustic transducer being acoustically active in a frequency range around a center frequency $f_1$;
an acoustic element arranged in the acoustic track, the acoustic element being acoustically active in the frequency range around the center frequency $f_1$; and
a grid structure arranged in the acoustic track between the first electroacoustic transducer and the acoustic element, wherein the grid structure is acoustically active in a frequency range around a center frequency $f_2$, where $f_2$ lies in a range around $2*f_1$.

11. The electroacoustic filter according to claim 10, wherein the acoustic element comprises a second electroacoustic transducer, a reflector, and/or a deflecting structure.

12. The electroacoustic filter according to claim 10, wherein
the grid structure is a reflecting structure and/or a bulk wave conversion structure; and
the electroacoustic filter functions using acoustic surface waves or guided bulk acoustic waves.

13. The electroacoustic filter according to claim 10, wherein the grid structure has a grid pitch $P_G$, which is selected in order to dissipate acoustic energy of a frequency component $f > f_1$.

14. The electroacoustic filter according to claim 10, wherein
the first electroacoustic transducer includes an area having a grid pitch of $P_1$;
the acoustic element includes an area having the grid pitch of $P_1$; and
the grid structure includes an area having a grid pitch of $P_G$, where $P_G < P_1$.

15. The electroacoustic filter according to claim 14, wherein the grid pitch $P_G$ of the grid structure comprises a pitch selected from the group consisting of a pitch $P > 0.5*P_1$, a pitch $P > 0.5*1.030*P_1$, and a pitch $P > 0.5*1.035*P_1$.

16. The electroacoustic filter according claim 10, wherein the acoustic element includes an area of split fingers having a grid pitch of $P_1$ and wherein a grid pitch of the grid structure comprises a pitch selected from the group consisting of a pitch $P > P_1$, a pitch $P > 1.030*P_1$, a pitch $P > 1.035*P_1$, and a pitch $P > 1.20*P_1$.

17. The electroacoustic filter according to claim 10, wherein the first electroacoustic transducer, the acoustic element, and/or the grid structure is designed as fan-shaped structures of a FAN filter.

18. The electroacoustic filter according to claim 10, wherein the grid structure comprises a metallization, a dielectric material, or recesses in the material of the acoustic track.

19. The electroacoustic filter according to claim 10, further comprising a phase structure in the acoustic track between the first transducer and the grid structure and/or between the grid structure and the acoustic element, wherein the velocity of an acoustic wave in the phase structure deviates from the velocity of the acoustic wave in the acoustic track outside the phase structure.

* * * * *